United States Patent
Mongillo et al.

(10) Patent No.: US 9,034,668 B2
(45) Date of Patent: May 19, 2015

(54) DEVICE AND METHOD FOR FORMING ON A NANOWIRE MADE OF A SEMICONDUCTOR AN ALLOY OF THIS SEMICONDUCTOR WITH A METAL OR A METALLOID

(75) Inventors: Massimo Mongillo, Grenoble (FR); Silvano De Franceschi, Fontaine (FR); Panayotis Spathis, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/810,742

(22) PCT Filed: Jul. 13, 2011

(86) PCT No.: PCT/EP2011/061924
§ 371 (c)(1),
(2), (4) Date: Apr. 1, 2013

(87) PCT Pub. No.: WO2012/010473
PCT Pub. Date: Jan. 26, 2012

(65) Prior Publication Data
US 2013/0203191 A1 Aug. 8, 2013

(30) Foreign Application Priority Data
Jul. 19, 2010 (FR) ...................................... 10 55847

(51) Int. Cl.
*H01L 21/00* (2006.01)
*H01L 21/3205* (2006.01)
(Continued)

(52) U.S. Cl.
CPC ........... *H01L 21/32053* (2013.01); *B82Y 10/00* (2013.01); *H01L 29/0665* (2013.01); *H01L 29/0673* (2013.01); *H01L 29/0843* (2013.01); *H01L 29/45* (2013.01); *H01L 29/66439* (2013.01); *H01L 29/66469* (2013.01); *H01L 29/775* (2013.01); *B22F 1/025* (2013.01); *B22F 2999/00* (2013.01); *B82Y 40/00* (2013.01); *Y10S 977/762* (2013.01); *H01L 29/413* (2013.01)

(58) Field of Classification Search
CPC ................... H01L 21/02603; H01L 21/02606; H01L 29/0669; H01L 29/413; H01L 2221/1094
USPC ..................................... 438/17; 977/762, 938
See application file for complete search history.

(56) References Cited

U.S. PATENT DOCUMENTS

| 5,298,784 A | 3/1994 | Gambino et al. |
| 8,072,012 B2 | 12/2011 | Verhulst et al. |

(Continued)

FOREIGN PATENT DOCUMENTS

| EP | 0562996 A1 | 9/1993 |
| EP | 1900681 A1 | 3/2008 |

(Continued)

*Primary Examiner* — Brook Kebede
(74) *Attorney, Agent, or Firm* — Hultquist, PLLC; Mary B. Grant

(57) ABSTRACT

Device for forming, on a nanowire made of a semiconductor, an alloy of this semiconductor with a metal or metalloid by bringing this nanowire into contact with electrically conductive metal or metalloid probes and Joule heating the nanowire at the points of contact with the probes so as to form an alloy such as a silicide. Application to the production of controlled-channel-length metal-silicide transistors.

26 Claims, 4 Drawing Sheets

(51) Int. Cl.
*B82Y 10/00* (2011.01)
*H01L 29/06* (2006.01)
*H01L 29/08* (2006.01)
*H01L 29/45* (2006.01)
*H01L 29/66* (2006.01)
*H01L 29/775* (2006.01)
*B22F 1/02* (2006.01)
*H01L 29/41* (2006.01)
*B82Y 40/00* (2011.01)

(56) References Cited

U.S. PATENT DOCUMENTS 8,148,220 B2 4/2012 Verhulst et al.
2008/0246020 A1 10/2008 Kawashima et al.

FOREIGN PATENT DOCUMENTS

| KR | 10-0844094 B1 | 7/2008 |
| WO | 2005093831 A1 | 10/2005 |

US 9,034,668 B2

DEVICE AND METHOD FOR FORMING ON A NANOWIRE MADE OF A SEMICONDUCTOR AN ALLOY OF THIS SEMICONDUCTOR WITH A METAL OR A METALLOID

CROSS-REFERENCE TO RELATED APPLICATIONS

This application is a U.S. national phase under the provisions of 35 U.S.C. § 371of International Patent Application No. PCT/EP11/61924 filed Jul. 13, 2011, which in turn claims priority of French Patent Application No. 1055847 filed Jul. 19, 2010. The disclosures of such international patent application and French priority patent application are hereby incorporated herein by reference in their respective entireties, for all purposes.

TECHNICAL FIELD

The invention relates to a device for forming on nanowires made of a semiconductor, an alloy of this semiconductor with a metal or metalloid.

The invention, in particular, relates to a device for forming silicides of metals such as nickel, on silicon nanowires.

The invention also relates to a method for forming on nanowires made of a semiconductor, an alloy of this semiconductor with a metal or a metalloid.

The device and method according to the invention in particular allow the formation on nanowires made of a semiconductor, of transistors with metal contacts, for which the length of the channel may be controlled.

The technical field of the invention may be defined generally as that of the preparation of devices based on nanowires made of a semiconductor, for example made of silicon, provided with contacts made of an alloy of this semiconductor with a metal or a metalloid, for example made of a metal silicide.

Such nanowires find their application in many electronic and opto-electronic devices, notably in field effect transistors (FET) and more particularly in field effect transistors with a metal-oxide-semiconductor structure (MOSFET).

STATE OF THE PRIOR ART

Silicon nanowires prepared by the chemical vapor deposition (CVD) method have been the subject of considerable interest these recent years for their future role as nanometric blocks assemblies for functional devices such as field effect transistors, nanophotodetectors, detectors, and logic circuits.

The « International Technology Roadmap for Semiconductors » (ITRS) provides that silicone nanowires will replace conventional « MOSFETs » because of their extensibility and their density of integration.

A conventional field effect transistor is a device with three electrodes in which the current which flows from the source to the drain is controlled by the potential at the gate electrode.

The source and drain regions are heavily doped, with a doping which is the opposite of that of the substrate.

The gate electrode is separated from the channel by a thin insulating layer. When a sufficiently high bias voltage is applied to the gate electrode, the surface of the substrate is inverted in order to form a conducting channel with a high density of carriers, and accordingly a current begins to circulate between the source electrode and the drain electrode.

The normal method scheme for making a « MOSFET » requires heavy doping of the source and drain contacts in order to allow efficient injection of the carriers into the channel.

The doping is followed by an activation of the dopant at a high temperature so that the ionization is total.

Presently, there exists an increasing interest for replacing the strongly doped region of « MOSFETs » with metal silicides in order to reduce the high parasitic resistances associated with the contacts.

The source/drain contact scheme which uses silicides requires a small provision of heat, inherently has low resistance, and the metal-channel junction is steep at an atomic level which has the consequence of better extensibility of the device.

The formation of the metal silicide contact is normally achieved by heating the metal in contact with the semiconductor.

In FIG. 1, a silicon nanowire is shown in contact with a nickel electrode. After thermal annealing in a furnace at a temperature of about 500° C., the penetration of the metal inside the nanowire is induced so as to thereby form a metal phase of nickel and of silicon, i.e. a metal silicide. This is confirmed by the observation of FIG. 1 wherein the brighter regions of the nanowire in the vicinity of the contact correspond to the nickel silicide phase.

For a given temperature, the length of the silicide portion varies according to the amount of metal which covers the nanowire, to the diameter of the nanowire and to the duration of the annealing treatment.

However, inherently, the thermal annealing treatment achieved in a furnace is not satisfactory as regards controlling the length of the silicide portion, mainly because of the variation of the diameter of the nanowire and of the quality of the metal film deposited on the nanowire.

Document EP-A1-0 562 996 describes an electrically programmable « anti-fuse » device which comprises a silicon substrate; a p-n junction formed in said silicon substrate; insulating means for example made of silica, for electrically and thermally insulating the p-n junction in said silicon substrate, the p-n junction being exposed through these insulating means, for example by means of a hole provided in these insulating means; a metal layer in contact with the p-n junction, which reacts with silicon for forming silicides on the p-n junction. The metal layer may be made of Ti, Cr, W, Mo or Ta.

In this document, the silicon substrate is a solid, bulk substrate and not a substrate consisting of silicon nanowires.

This document specifically relates to the preparation of « antifuse » devices, and does absolutely not relate to the preparation of transistors with silicon nanowires which are devices which one more particularly seeks to prepare according to the present invention.

Therefore as regards the foregoing, there exists a need which is still not met for a device and a method for forming on nanowires made of a semiconductor for example made of silicon, an alloy of this semiconductor with a metal or metalloid, for example a metal or metalloid silicide, which gives the possibility of reliably, accurately and reproducibly regulate, control the formation of this alloy.

Notably, there exists a need for such a device and such a method which reliably, accurately and reproducibly allows control of the length, and optionally of the depth, of the portion of the semiconducting nanowire which is transformed into an alloy of this semiconductor, for example into a metal or metalloid silicide.

More specifically there exists a need for such a device and such a method which ensures such a reliable and accurate control, regardless of the characteristics of the metal or of the metalloid (for example quality, thickness of a film of the latter) in contact with the nanowire with the purpose of forming the alloy, and regardless of the characteristics of the nanowire, for example of its diameter.

The goal of the invention is to provide a device and method for forming on nanowires made of a semiconductor, for example made of silicon, an alloy of this semiconductor with a metal or metalloid, which i.a. meets the needs listed above.

The goal of the invention is further to provide such a device and such a method which do not have the drawbacks, flaws, defects, limitations and disadvantages of the devices and methods of the prior art and which solve the problems of the devices and of the methods of the prior art.

SUMMARY OF THE INVENTION

This goal, and further other ones, are achieved according to the invention by a device for forming on a nanowire made of a semiconductor, an alloy of this semiconductor with a metal or metalloid, said device comprising:

a first electrically conducting strip made of a metal or metalloid capable of forming an alloy with the semiconductor of the nanowire, and a second electrically conducting strip made of a metal or metalloid capable of forming an alloy with the semiconductor of the nanowire, spaced apart from each other, the first and the second electrically conducting strips forming a narrowed portion of a first electrically conducting line and of a second electrically conducting line, respectively, said first and second electrically conducting lines each comprising a first end and a second end, the central portion of the first electrically conducting strip being able to be put into contact with a first area of the surface of the nanowire and the central portion of the second electrically conducting strip being able to be put into contact with a second area of the surface of the nanowire, spaced apart from the first area in the direction of the length of the nanowire;

means for applying a potential difference between the first end of the first electrically conducting line and the second end of the first electrically conducting line and making a current pass from the first end to the second end of the first electrically conducting line, and means for connecting the second end of the second electrically conducting line to the ground, said means comprising a resistor R;

optionally, means for applying a potential difference, between the first end of the second electrically conducting line and the second end of the second electrically conducting line when no potential difference is applied, between the first end of the first electrically conducting line and the second end of the first electrically conducting line and making a current pass from the first end to the second end of the second electrically conducting line, and optionally means for connecting the second end of the first electrically conducting line to the ground, said means comprising a resistor R';

means for measuring a potential difference, said to be a first leakage potential difference on both sides of the resistor R;

optionally, means for measuring a potential difference, said to be a second leakage potential difference on either side of the resistor R';

means for applying a potential difference said to be a first bias potential difference between the first area of the surface of the nanowire and the second area of the surface of the nanowire, in the direction of the length of the nanowire;

optionally, means for applying a potential difference, said to be a second bias potential difference between the second area of the surface of the nanowire and the first area of the surface of the nanowire, in the direction of the length of the nanowire when the first bias potential difference is not applied.

The first and second conducting strips may also be designated as « striplines ».

By « narrowed portion », is generally meant that this portion has a section, generally a cross section, smaller than the average section of the remainder of the electrically conducting line.

Advantageously, the first and second electrically conducting strips may be parallel.

Advantageously, the first and second electrically conducting strips each have a length from 1 to 5 µm, for example 3 µm.

Advantageously, the first and the second electrically conducting strips are spaced apart from each other by 100 to 300 nm, for example 200 nm to 300 nm, preferably 200 nm.

The first and second electrically conducting strips may be made of any metal or metalloid capable of forming alloys with the semiconductor making up the nanowire.

Advantageously, the first and second electrically conducting strips may be made of nickel or made of platinum.

Advantageously, the means for applying a potential difference, between the first end of the first electrically conducting line and the second end of the first electrically conducting line, and the oprional means for applying a potential difference, between the first end of the second electrically conducting line and the second end of the second electrically conducting line may include means for increasing or reducing this(these) potential difference(s) continuously or incrementally, either manually or automatically, for example depending on the measured value of the first leakage potential difference, or of the second leakage potential difference, respectively.

Advantageously, the means for applying a potential difference, between the first end of the first electrically conducting line and the second end of the first electrically conducting line and the means for applying a potential difference, said to be a first bias potential difference between the first area of the surface of the nanowire and the second area of the surface of the nanowire, in the direction of the length of the nanowire consist of a same first voltage generator.

Advantageously, the optional means for applying a potential difference, between the first end of the second electrically conducting line and the second end of the second electrically conducting line, and the optional means for applying a potential difference, said to be a second bias potential difference between the second area of the surface of the nanowire and the first area of the surface of the nanowire, in the direction of the length of the nanowire consist of a same second voltage generator.

Advantageously, said first and said second voltage generators are replaced with a single voltage generator (consist of one and same generator) which may apply a potential difference, between the first end of the first electrically conducting line and the second end of the first electrically conducting line and a potential difference, between the first area of the surface of the nanowire and the second area of the surface of the nanowire, in the direction of the length of the nanowire, or else which may apply a potential difference, between the first end of the second electrically conducting line and the second end of the second electrically conducting line, and a potential difference, between the second area of the surface of the nanowire and the first area of the surface of the nanowire, in the direction of the length of the nanowire.

Advantageously, the first electrically conducting line and the second electrically conducting line may each comprise several first electrically conducting strips and second electrically conducting strips.

It is thus possible to treat several nanowires simultaneously.

If all the electrically conducting strips formed along a same electrically conducting line (for example the first electrically conducting line) and all the nanowires to be treated have the same resistivity, it is then possible to apply a single potential difference between the first end of this electrically conducting line and the second end of this electrically conducting line.

The device according to the invention has neither been described nor suggested in the prior art.

The device according to the invention meets the whole of the needs listed above for such a device and provides a solution to the problems posed by the devices of the prior art.

The device according to the invention notably gives the possibility of accurately, reliably controlling the leakage current and therefore the formation of the semiconductor alloy, for example a metal silicide, and in particular the length of the portion of the nanowire made of a semiconductor, for example made of silicon, transformed into a metal alloy, for example into a metal or metalloid silicide.

The device according to the invention comprises as essential elements, two electrically conducting strips (« striplines »).

Each of these two electrically conducting strips has a defined role.

The first electrically conducting strip is used for forming the alloy of semiconductor and of metal or metalloid, for example of metal or metalloid silicide.

The first electrically conducting strip is connected to means with which a current may be passed from its first end to its second end.

The first electrically conducting strip forms a shrinkage, narrowing a shrunk, narrowed portion or constriction in the first electrically conducting line. This narrowed portion restricts passing of the current from the first end of the first conducting line to the second end of the first electrically conducting line. It may also be stated that this narrowed portion locally limits, impedes, disturbs, the passing of this current.

Because the intensity of the current remains the same when the current passes into this narrowed portion, there results an increase in the current density in this narrowed portion, which locally causes, in this narrowed portion, heating of the strip by Joule effect.

In other words, the applied potential difference mainly drops along this shrink portion and accordingly, the temperature of the first electrically conducting line is higher at this narrowed portion.

The heating of the first electrically conducting strip is generally maximum in the central portion of the first electrically conducting strip, and still specifically, in the middle of the latter.

In other words, the hottest point of the first electrically conducting strip is located in the central, middle portion of this electrically conducting strip and still more specifically in the middle of the latter.

This central portion of the first electrically conducting strip is either made of a metal or made of a metalloid, for example nickel which is capable of forming an alloy with the semiconductor of the nanowire, and this central portion is capable of being put into contact with a first area of the surface of a nanowire made of a semiconductor (for example made of silicon) so that during the putting in contact of the nanowire and of the first electrically conducting strip, local heating of the contact and formation of an alloy of the semiconductor and of the metal or metalloid, for example the formation of a metal silicide, thereby occur.

The second electrically conducting line (2) is not, during the first step of the method according to the invention, connected to means which allow a current to pass from its first end to its second end.

Indeed, during the first step, it is not necessary to connect the first (4) and second (6) ends of the second electrically conducting line (2) to external generators providing a current which passes into the line (2) (see FIG. 2).

This second line should, during the first step, only be connected as this is shown in FIG. 2, to the resistor R in order to be able to measure the leakage potential difference ($V_{leak}$).

When this leakage potential has a jump, as this is shown in FIG. 6, corresponding to a current (leakage current) in the nanowire of the order of a few nanoampers (in the case of a non-doped nanowire), it is then known that the formation of the alloy for example the silicon alloy (« silicidation ») occurs at the first area of the surface of the nanowire (first contact).

Of course, for preparing a transistor, the role of the first (1) and second (2) electrically conducting lines is then inverted as this is explained further on, and the line (2) will then be connected to external generators which allow a current to pass from its first end (4) to its second end (6).

During the first step, the second end (6) of the second electrically conducting line (2) is simply connected to the ground through means which comprise a resistor R in series (with the nanowire when the latter is present), means being provided for measuring the potential difference, said to be a first leakage potential difference on either side of the resistor R.

The second electrically conducting strip and the associated means therefore then play a role of a control of the leakage current, which also allows, possibly monitoring, controlling or regulating the penetration of the metal or metalloid into the nanowire made of a semiconductor, for example made of silicon and therefore the length of the nanowire portion transformed into an alloy, for example into a metal silicide.

The invention also relates to a method for forming, on at least one nanowire made of a semiconductor, an alloy of this semiconductor with a metal or metalloid, wherein the following successive steps are performed:

a) said at least one nanowire made of a semiconductor is deposited on a substrate, for example a layer, made of an electrically insulating material, optionally positioned on another substrate made of a material different from said electrically insulating material;

b) a first area of the surface of the nanowire is put into contact with a central portion of a first electrically conducting strip, made of a metal or metalloid capable of forming an alloy with the semiconductor of the nanowire, forming a narrowed portion between a first end and a second end of a first electrically conducting line, and a second area of the surface of the nanowire, spaced apart from the first area in the direction of the length of the nanowire is put into contact with a central portion of a second electrically conducting strip, made of a metal or metalloid capable of forming an alloy with the semiconductor of the nanowire, forming a narrowed portion between a first end and a second end of a second electrically conducting line;

c) a potential difference, said to be a first bias potential difference, is applied between the first area of the surface of the nanowire and the second area of the surface of the nanowire, in the direction of the length of the nanowire;

d) a potential difference, said to be a first heating potential difference is applied between the first end of the first electrically conducting line and the second end of the first electrically conducting line, while maintaining constant the first bias potential difference, and a potential difference, said to be a first leakage potential difference is measured simultaneously on both sides of a resistor R in series with the nanowire, located between the second end of the second electrically conducting line and the ground.

e) the first heating potential difference is continuously or incrementally increased, either manually or automatically, generally from a value close to zero, until a jump of the first leakage potential difference is observed, indicating that the first heating potential difference is then sufficient for causing heating-up of the central portion of the first electrically conducting strip and of the first area of the surface of the nanowire, diffusion of the metal or metalloid into and along the nanowire and formation of the alloy.

Advantageously, the semiconductor may be silicon, optionally doped silicon.

Although the method according to the invention has actually been only applied with silicon nanowires, the man skilled in the art will understand that the method according to the invention may also be successfully applied with other semiconductors.

In fact, in order to form metal alloys with semiconductors, the use of heat treatments, such as rapid thermal annealing or furnace annealing is required. With the method of the invention, it is possible to produce the required heat by heating by the Joule effect.

The method according to the invention may be applied successfully with all kinds of nanowires regardless of their diameters or sizes.

Advantageously, the nanowires may have a length from 0.5 to 10 µm, preferably from 1 to 10 µm, and a diameter from 20 to 50 nm.

The chemical nature of the substrate is not important, it should only be insulating and withstand high temperatures for example close to about 500° C. due to the heating through the Joule effect.

Advantageously, the substrate made of an electrically insulating material is a silica layer optionally positioned on a substrate made of strongly doped silicon; a substrate, for example a layer made of silicon nitride; or a substrate, for example a layer made of alumina.

Advantageously, it is possible to deposit several nanowires on the substrate made of an electrically insulating material, said nanowires being randomly positioned, their position being marked by means of markers made beforehand on the substrate; or according to ordered structures, patterns, for example in the form of ordered rows of nanowires.

The first and second electrically conducting strips may be made of any metal or metalloid capable of forming alloys with semiconductors.

Advantageously, the first and the second electrically conducting strips may be made of nickel or made of platinum.

Although the method according to the invention has actually only been applied with nickel and platinum, the man skilled in the art will understand that the method according to the invention may also be successfully applied with other metals or metalloids capable of forming alloys with semiconductors.

Advantageously, the thickness of the metal or metalloid layer should be much greater than the diameter of the nanowire, for example a thickness from 80 to 120 nm is sufficient for nanowires with a diameter of 20 nm.

Advantageously, according to the first measured leakage potential difference, the first heating potential difference is modified.

The potential difference measured on both sides of the resistor R, which is called $V_{leak}$, tells us which is the current which circulates in the nanowire for a given value of the current which passes in the first electrically conducting strip (7) and of the potential difference which drops in the nanowire between the points (17) and (18) of FIG. 2.

For example by means of an operational amplifier, it is possible to decouple the heating current which passes in the first electrically conducting strip (7) from the bias potential which is applied to the nanowire between the points (17) and (18) (or rather between the points (19) and (20)) shown in FIG. 2.

In other words, it is possible to maintain the bias voltage set, for example to 1 volt, between the points (17) and (18) (or rather (19) and (20)) of FIG. 2, while the current which circulates in the first electrically conducting strip (7) is increased until a current of for example a few nanoamperes is measured in the resistor R.

It may be noted that the leakage current in the resistor R is indicative, it changes according to the potential drop between the points (17) and (18) in FIG. 2.

Advantageously, at the end of step e), the following steps f), g), h) are carried out:

f) a potential difference, said to be a second bias potential difference is applied between the second area of the surface of the nanowire and the first area of the surface of the nanowire, in the direction of the length of the nanowire;

g) a potential difference, said to be a second heating potential difference is applied between the first end of the second electrically conducting line and the second end of the second electrically conducting line, while maintaining constant the second bias potential difference, and a potential difference, said to be a second leakage potential difference is simultaneously measured on both sides of a resistor R' in series with the nanowire located between the second end of the first electrically conducting line and the ground;

h) the second heating potential difference is continuously or incrementally increased, either manually or automatically, generally from a value close to zero, until a jump in the second leakage potential difference is observed indicating that the second heating potential difference is then sufficient for causing heating-up of the central portion of the second electrically conducting strip and of the second area of the surface of the nanowire, diffusion of the metal or of the metalloid into and along the nanowire and formation of the alloy.

It is during this step h) that the length of the channel of the transistor is monitored, controlled.

In fact, by means of a calibration curve, such as the one of FIG. 4, it is possible to determine the length of the channel corresponding to a certain value of the leakage current measured in the resistor R' or R.

FIG. 4 shows the length of the channel measured according to the leakage current which circulates in the resistor R or R'.

The leakage current is measured by biasing the nanowire between the points (18) and (17) (or rather (20 and 19)) as indicated in FIG. 2 with a constant bias voltage, for example 1 volt.

The bias potential in the nanowire between the points (18) and (17) is maintained constant, fixed while the heating current which passes into the electrically conducting strip (8) is increased until one begins to measure a leakage current which flows through the resistor R'.

Advantageously, according to the measured second leakage potential difference, the second heating potential may be modified.

Advantageously, the first heating potential difference and/or the second heating potential difference is(are) modified in order to obtain a first portion made of an alloy and/or a second portion made of an alloy of determined length(s) along the nanowire from the first area of the surface of the nanowire and from the second area of the surface of the nanowire, respectively.

Advantageously, the portion made of a semiconductor of the length of the nanowire between the first portion made of alloy and the second portion made of alloy is the channel of a transistor.

Advantageously, a calibration curve is established which gives for each value of the leakage current(s), the length of the channel of the transistor and the first and/or second heating potential is adjusted so as to obtain the desired channel length.

Advantageously, the electrically conducting strips are directly defined on the nanowires, for example by a lithography method.

The method according to the invention has neither been described nor suggested in the prior art.

The method according to the invention meets the whole of the needs listed above for such a method and provides a solution for the problems posed by the methods of the prior art.

It is possible to notably state that the method according to the invention, inherently has all the effects and advantages due to the fact that it is applied with the device described above.

With the method according to the invention, it is notably possible to control with accuracy, reliability, the leakage current and therefore the formation of the alloy such as the metal silicide and in particular the length and the depth of the portion of the silicon nanowire transformed into an alloy, for example into a metal silicide.

The invention will be better understood upon reading the detailed description which follows given as an illustration and not as a limitation, this description being made with reference to the appended drawings wherein:

Figure 1:
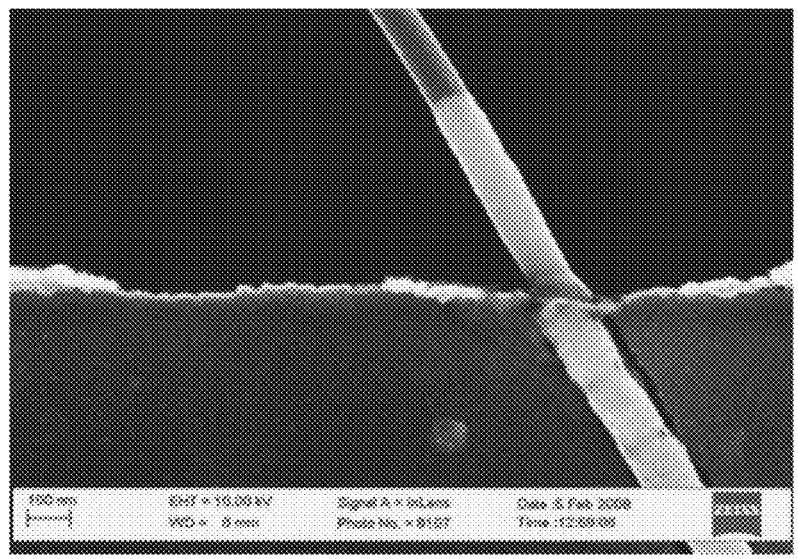
FIG. 1 is a microphotograph taken with a scanning electron microscope (SEM) of a silicon nanowire put into contact with a nickel electrode and annealed in a furnace at 500° C.

The scale illustrated in FIG. 1 is 100 nm.

Figure 2:
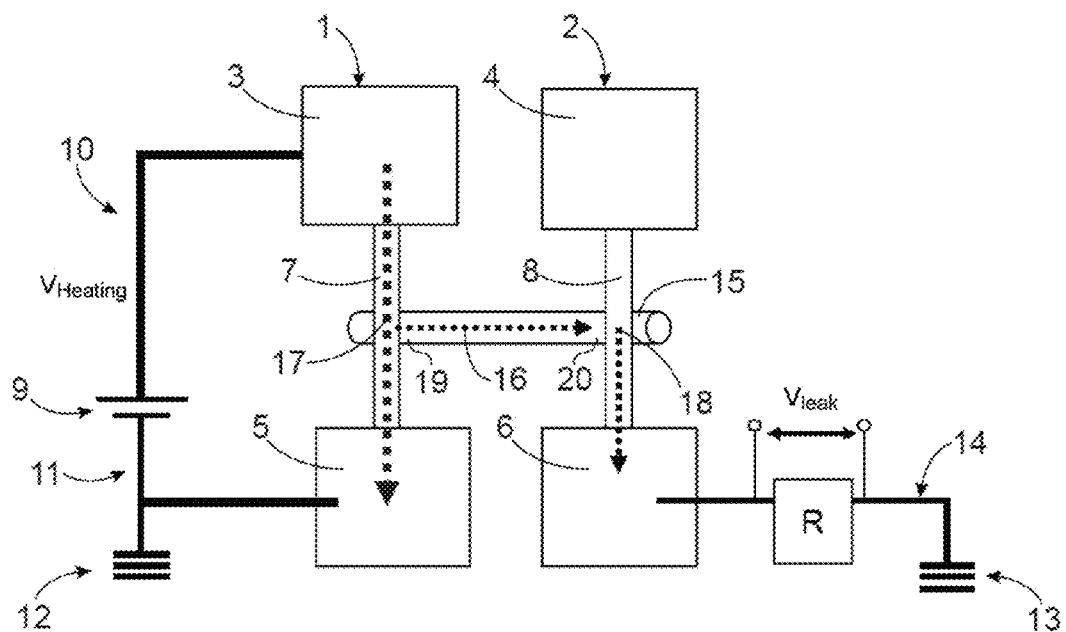

FIG. 2 is a schematic top view of a device according to the invention, for applying the method according to the invention.

Figure 3:
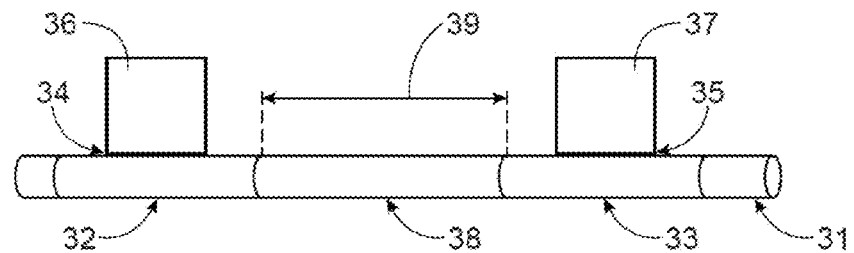

FIG. 3 is a schematic view of a transistor with nanowires prepared by the method according to the invention.

Figure 4:
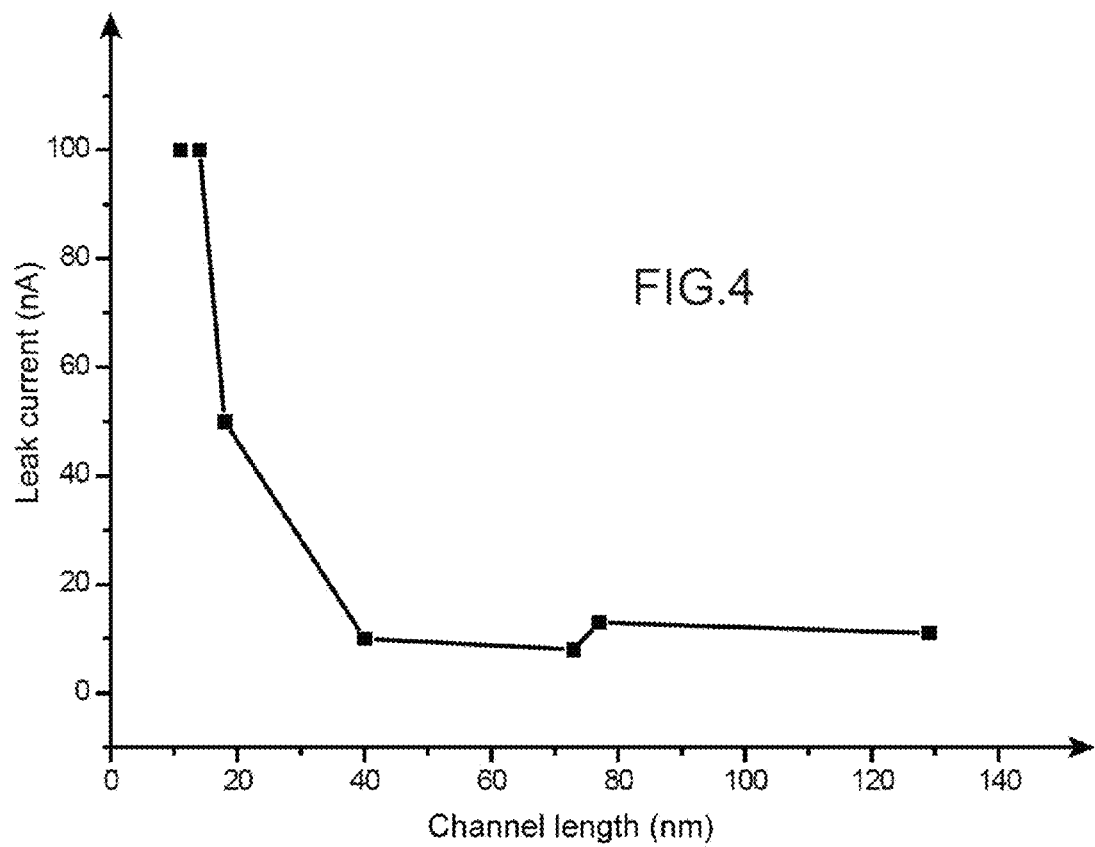

FIG. 4 is a graph in which the leakage current measured in the nanowire is plotted in ordinates (in nA), and in which the length (in nm) of the channel of a transistor with a silicon nanowire (silicon nanowire transistor) prepared by the method according to the invention is plotted in abscissas.

Figure 5:
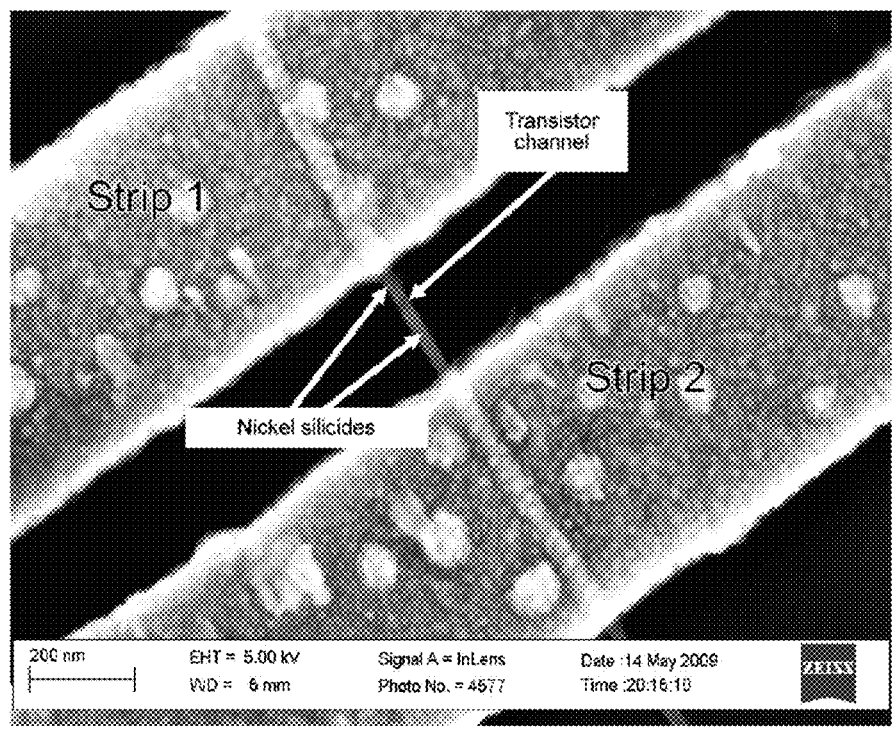

FIG. 5 is a microphotograph, taken with the scanning electron microscope which shows a transistor with a nanowire with its channel, its portions made of nickel silicide and the two electrically conducting strips (strip (1) and strip (2)) of the device applied for its preparation.

The scale illustrated in FIG. 5 is 200 nm.

Figure 6:
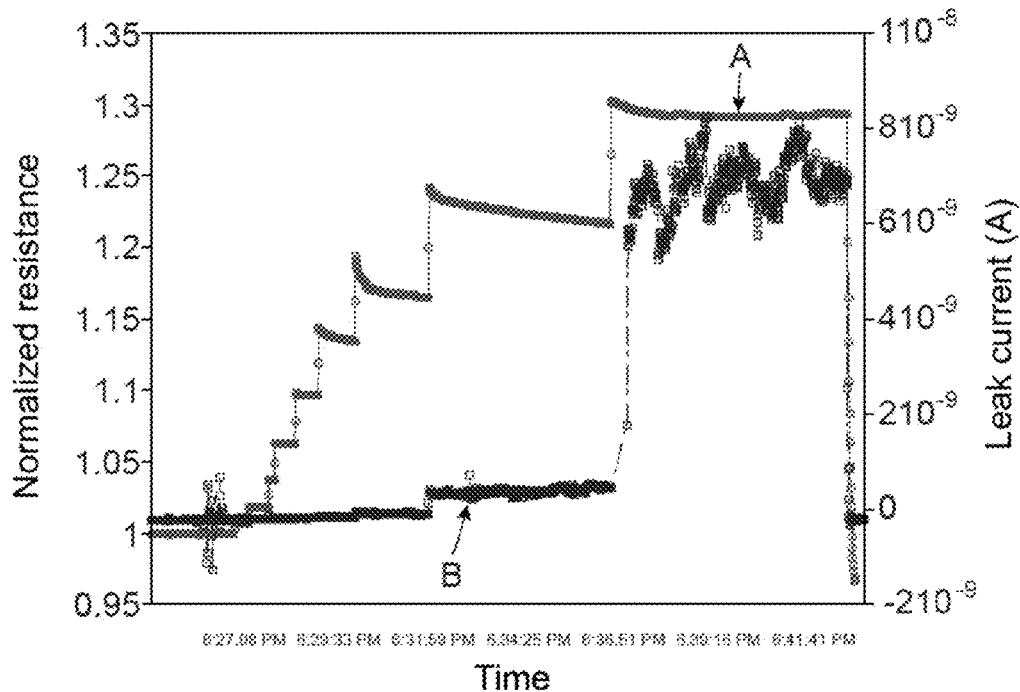

FIG. 6 is a graph which shows the time-dependent change in the normalized resistance of the strip (curve A) and of the leakage current circulating in the nanowire (curve B).

The normalized resistance is plotted in ordinates, on the left, the leakage current (in A) is plotted in ordinates on the right and the time is plotted in abscissas.

Figure 7:
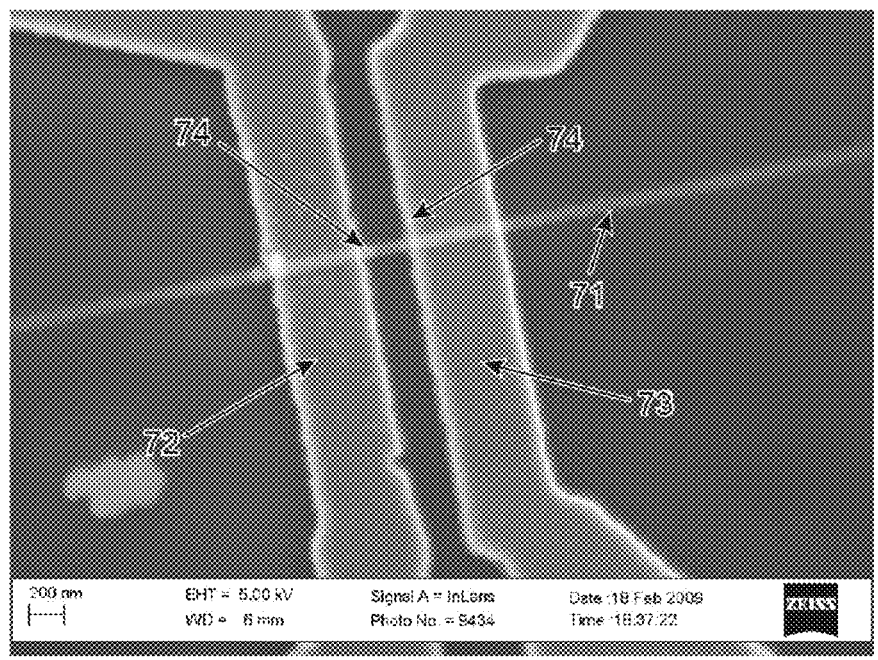

FIG. 7 is a microphotograph taken with the scanning electron microscope of a device according to the invention in which a silicon nanowire is fitted which has undergone a heat treatment by Joule effect carried out on both strips.

The scale illustrated in FIG. 7 is 200 nm.

Figures 8A, 8B:
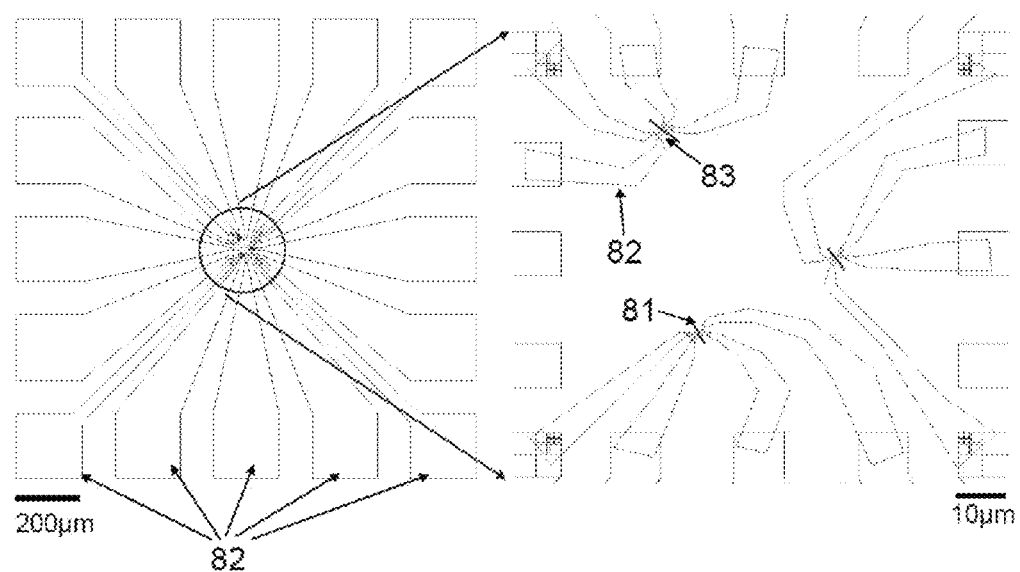

FIGS. 8A and 8B show a top view of a substrate on which are positioned several nanowires and several devices according to the invention with conducting lines comprising narrowed portions.

FIG. 8B is an enlargement of the central portion of FIG. 8A.

The scale illustrated in FIG. 8A is 200 µm and the scale illustrated in FIG. 8B is 10 µm.

DETAILED DESCRIPTION OF PARTICULAR EMBODIMENTS

A device according to the invention is described in FIG. 2.

This device comprises a first electrically conducting line (1) and a second electrically conducting line (2).

Both lines (1, 2) are generally placed in a same horizontal plane.

These lines (1, 2) generally have a rectangular or square cross-section.

For example, the lines (1, 2) may have a thickness, a height from 80 to 120 nm and a width from 5 to 10 µm.

These lines (1, 2) are electrically conducting and generally consists of an electrically conducting material which is selected from metals and metalloids, such as nickel or platinum, capable of forming metal alloys with semiconducting materials.

As this was specified above, although the invention was actually applied only with nickel and platinum, the man skilled in the art will understand that the method according to the invention may also be successfully applied with other metals or metalloids capable of forming alloys with semiconductors.

The first (1) and the second (2) electrically conducting lines each comprise a first end (3, 4) and a second end (5, 6).

The first electrically conducting line (1) comprises a first conducting strip (7) (also called a « stripline » ) which forms a narrowed portion (7) between the first end (3) and the second end (5) of the first electrically conducting line (1); and the second electrically conducting line (2) comprises a second electrically conducting strip (8) (also called « stripline » ) which forms a narrowed portion (8) between the first end (4) and the second end (6) of the second electrically conducting line (2).

By narrowed portion (7, 8) is generally meant that this portion has a section, generally a cross-section smaller than the remainder of the first (1) and the second (2) conducting lines and more specifically a cross-section smaller than the cross-section of the first end (3, 4) and of the second end (5, 6) of said conducting lines (1, 2).

As an example, the section of the conducting strip or narrowed portion (7) of the first conducting line (1) may be equal to 0.01-0.1, preferably 0.05-0.1 times the cross-section of the first end (3) and of the second end (5) of the first conducting line (1). The same applies for the conducting strip (8) of the second electrically conducting line (2).

Typically, the section of the electrically conducting strips (7, 8) may be from $10^4$ to $10^5$ $nm^2$ while the section of the electrically conducting lines (1, 2) may be of the order of $10^6$ $nm^2$.

The values given for these sections are indicative and are only given as an example. They correspond to the typical dimensions which have been used in the examples.

The most important point to be retained is the ratio between the section of the strip (7) ((8) respectively) and the section of the line (1) ((2) respectively) in (3) or (5) (in (4) or (6) respectively).

As this has already been indicated above, a value of this ratio for example from 0.01 to 0.1, preferably from 0.05 to 0.1 seems to be reasonable.

Generally, the first end (3, 4) and the second end (5, 6) of each of the electrically conducting lines (1, 2) have a greater section than the narrowed portion (7, 8) of each of these lines since these ends (3, 4, 5, 6) have, as this is illustrated in FIG. 2, a larger width than the width of the narrowed portion (7, 8) of each of the electrically conducting lines (1, 2) while the height, thickness of the first (3, 4) and second ends (5, 6) and of the narrowed portion (7, 8) is generally identical.

For example, for narrowed portions (7, 8) («striplines») with a width of 500 nm, lines (1) and (2) are used with a width generally comprised between 5 and 10 µm.

The height of the lines (1, 2) and of the narrowed portions (7, 8) is generally greater than the diameter of the nanowires. For a nanowire with a diameter for example of 20 nm, heights between 80 and 120 nm are typically used.

As this is illustrated in FIG. 2, the first and second conducting strips (7, 8) may be parallel.

Generally, the first and second electrically conducting strips (7, 8) have the same length as this is illustrated in FIG. 2.

However, it is not necessary that the conducting strips, "striplines", (7, 8) compulsorily have the same length.

The first and the second conducting strips (7, 8) each generally have a length from 1 to 5 µm, for example 3 µm.

The spacing, distance, gap, between the electrically conducting strips (7, 8), has an influence on the leakage current measured in the circuit and on the formation of the alloy, for example of the metal silicide.

The larger the spacing, the lower is the measured leakage current.

A spacing of about 1 µm between the electrically conducting strips (7, 8) does not generally provide any appreciable leakage current in the case of non-doped nanowires such as those used in the examples.

However, the situation may be different if the nanowires are doped.

Further, the process for forming the alloy, for example the «silicidation» process by Joule effect heating is self-limiting.

Indeed, the lengths of the alloy portions for example made of metal or metalloid silicide, of the nanowires may be at most of about 100 to 150 nm.

This means that if two electrically conducting strips were positioned with a spacing between them of 1 µm, the length of the transistor channel which may be formed would be at most of 700 nm.

If the method has to be used for making transistors with very short channel lengths, of less than 100 nm for example as this is required by the "ITRS" roadmap, the spacing between the two electrically conducting strips should be at most 300 nm.

The first and second conducting strips (7, 8) are therefore generally spaced apart from each other by 100 to 1,000 nm, preferably from 100 nm to 300 nm, for example 200 nm.

The device according to the invention further generally comprises means for applying a determined potential difference, said to be a first heating potential difference $V_{heating}$, between the first end (3) of the first electrically conducting line (1) and the second end (5) of the first electrically conducting line (1) and for thus causing a current to pass from the first end (3) to the second end (5) of the first electrically conducting line (1).

These means generally comprise a voltage generator (9), one of the terminals of which is connected to the first end (3) of the first electrically conducting line (1) through a first cable (10) and the other terminal is connected to the second end (5) of the first electrically conducting line (1) through a second cable (11) which is generally also connected to ground (earth) (12).

Advantageously, the voltage generator (9) may include means (not shown) with which the heating voltage may be increased or reduced continuously or incrementally, either manually or automatically, for example depending on the measured values of the first leakage potential difference.

The device according to the invention generally further comprises means for applying a potential difference said to be a first bias potential difference between the first area of the surface of the nanowire (17) (or rather (19)) and the second area of the surface of the nanowire (18) (or rather (20)) in the direction of the length of the nanowire.

These means for applying a potential difference, said to be a first bias potential difference, generally also consist of the same voltage generator (9).

In other words, the voltage generator (9) mentioned in FIG. 2 and which provides the first heating voltage in the first line (1) should generally provide two functions:

1) It should provide the intended, desired, generally adjustable, adaptable heating current which passes into the electrically conducting strip (7) which causes heating by Joule effect of this electrically conducting strip and which causes the formation of an alloy phase, for example of a silicide phase.

2) It should provide the bias voltage in the nanowire between the points (17) and (18) ((19) and (20)) which is maintained, set, constant while the heating current which passes in the first electrically conducting strip (7) is modified.

In order to allow the generator to accomplish both of these functions, it is for example possible, as this has been the case in experiments conducted by the inventors, to use an operational amplifier.

Such a device is known to the man skilled in the art and will not be described in further details.

Devices other than an operational amplifier may be used.

The important fact is that the generator (9) be able to provide the heating current which causes the heating by Joule effect, this current being able to be continuously or incrementally modified, and a constant, set, bias voltage over the length of the nanowire between the points (17) and (18) ((19) and (20)).

The second end (6) of the second conducting line (2) is connected to the ground (13) via a cable (14) on which is placed a resistor R in series with the nanowire (15) when the latter is positioned in the device according to the invention.

Means such as a voltmeter are provided for measuring the potential difference, said to be a first leakage potential difference ($V_{leak}$) on either side of the resistor R.

The value of this leakage potential difference reflects the current (16) which passes into the nanowire (15).

One thus has a simple means for monitoring, tracking the value of the current which may be called a leakage current which circulates in the nanowire (15) and thus monitor, track the formation of the alloy, for example of the metal silicide.

As this has already been seen above, the device according to the invention may optionally comprise means (not shown)

allowing modification of the current which passes into the first electrically conducting line (1) and into the first electrically conducting strip (7), (actually it is the same current which passes into the first electrically conducting line (1) and into the first electrically conducting strip (7)) and finally the amount of heat dissipated by Joule effect at the contact (19) between the nanowire (15) and the portion of the first electrically conducting strip (7) in contact with the latter.

The device according to the invention may also comprise means with which for each value of the heating current, the potential difference applied to the nanowire between the first portion or area (19) of the surface of the nanowire and the second portion or area (20) of the surface of the nanowire may be modified.

It should be noted that in the device according to the invention, the roles of the first electrically conducting line (1) and of the second electrically conducting line (2) may be inverted i.e. the heating potential may be equally applied to the first line (1) or to the second line (2), the other line being then connected to the ground via a resistor R or R', in the latter case, the heating potential is applied to the second line (2).

The device according to the invention may thus further optionally comprise means for applying a determined potential difference, also said to be a heating potential difference $V_{heating}$, between the first end (4) of the second electrically conducting line (2) and the second end (6) of the second electrically conducting line (2) and thus cause a current to pass from the first end (4) to the second end (6) of the second electrically conducting line (2).

These means generally comprise a voltage generator (called (9') by convenience, but not shown), one of the terminals of which is connected to the first end (4) of the second electrically conducting line (2) through a first cable and the other terminal is connected to the second end (6) of the second electrically conducting line (2) through a second cable which generally is also connected to ground.

Advantageously, the voltage generator (9') may include means with which the heating voltage may be increased or reduced continuously or incrementally, either manually or automatically, for example according to the measured values of the leakage potential difference.

The device according to the invention may optionally further comprise means for applying a potential difference said to be a second bias potential difference between the second area of the surface of the nanowires (18) (or rather (20)) and the first area of the surface of the nanowire (17) or rather (19) in the direction of the length of the nanowire.

These means for applying a potential difference, said to be a second bias potential difference generally also consists of the same voltage generator (9').

It should be noted that a single generator may be used for both fulfilling the role of generators (9) and (9'), this single generator may be connected either to the ends (3, 5) of the first electrically conducting line (1), or to the ends (4, 6) of the second electrically conducting line (2) through suitable cables.

When the heating voltage is applied to the second electrically conducting line (2), the second end (5) of the first electrically conducting line (1) is connected to the ground via a cable on which is placed a resistor R' in series with the nanowire (15), when the latter is positioned in the device according to the invention.

Means, such as a voltmeter, are provided for measuring the potential difference, said to be a second leakage potential difference ($V_{leak}$) on either side of the resistor R'.

It should be noted that a single resistor may be used for both fulfilling the role of the resistors R and R', this single resistor may be connected either to the second end (5) of the first electrically conducting line (1) and to the ground, or to the second end (6) of the second electrically conducting line (2) and to the ground, through suitable cables.

The method according to the invention which generally applies the device as described in detail above and in FIG. 2 will now be described.

In this method, one begins by depositing nanowires made of a semiconductor on a substrate, for example a layer-shaped substrate, this substrate being made of an electrically insulating material.

The nanowires may be made of any semiconductor which may form an alloy with a metal or metalloid. This metal or metalloid is of course different from the semiconductor of the nanowires.

Preferably, the silicon nanowires are optionally doped silicon nanowires.

The nanowires such as the silicon nanowires may be prepared by any suitable method.

For example, the silicon nanowires may be prepared by growing on a substrate by means of a chemical vapor deposition or «CVD» method and then separated from this substrate.

Or else the silicon nanowires may be prepared by the standard etching method used in the industry for manufacturing integrated circuits.

The method according to the invention may be successfully applied with all kinds of nanowires regardless of their diameters or lengths.

Advantageously, the nanowires may have a length from 0.5 to 10 µm and a diameter from 20 to 50 nm.

The nanowires which were used for applying the invention, notably in the enclosed examples, generally have a length of the order of 10 µm and a diameter from 20 to 50 nm.

However, the invention may also be applied with nanowires of smaller or larger diameter provided that their length is at least 0.5 µm.

Any type of electrically insulating material which is thermally stable may be used for constituting the electrically insulating substrate, for example the electrically insulating layer on which are deposited the nanowires.

The electrically insulating substrate may optionally also play the role of a heat, thermal, sink. Accordingly, the material of the electrically insulating substrate may optionally but not necessarily be also heat-conducting.

It may be believed that the thermal properties of the insulating substrate might have an influence on the method, for example on the maximum penetration of the formed alloys such as silicides.

In other words, by using an electrically insulating substrate with a lower heat conductivity, it may optionally be possible to obtain a greater penetration depth of the alloys, such as the silicides formed.

An important point is that the electrically insulating substrate may withstand temperatures above those required for the formation of the metal (metalloid) semiconductor alloys, i.e. several hundred degrees Celsius.

Thus, in the case of silicon nanowires prepared by growth on a substrate by means of a vapor deposition method, they may be deposited on a substrate, for example a substrate in the form of a layer, made of silica, made of silicon nitride or made of alumina.

These are only examples of substrates, for example in the form of layers, where the nanowires may be deposited.

Other substrates may be used, the important point being that the nanowires are deposited on an insulating substrate which is also thermally stable.

The substrate, notably when it is the form of a layer, made of an electrically insulating material, may be positioned on the top of another substrate made of another material.

For example, the nanowires, for example made of silicon, may be deposited on an $SiO_2$ layer, for example with a thickness of 300 nm, on the top of a substrate made of heavily doped silicon.

However, the presence of a heavily doped substrate does not affect the process, since the important point is that the nanowires have to be deposited on a substrate, for example a layer, which is electrically insulating.

In order to deposit the nanowires, for example made of silicon, on the substrate, for example the layer, made of an electrically insulating material, it is for example possible to disperse them in a suitable solvent, such as an alcohol like isopropanol and deposit this solution on the layer made of an electrically insulating material. Once the solvent has been evaporated, a layer is obtained on which the nanowires are deposited.

The positions of the nanowires deposited on the layer are generally random positions. The nanowires may however be located, localized on the layer by means of marks defined, made, beforehand on the layer.

The fact that the nanowires occupy, random positions, locations on the substrate does not have any impact on the process since once the nanowires are deposited on the surface, they may be easily localized, optionally by means of the marks mentioned above.

However, the method according to the invention may easily be adapted in the case when it is desired that the nanowire be positioned according to ordered structures, patterns, for example as ordered rows of nanowires positioned in a plane.

In this case, it is necessary to better control the specific positions of the nanowires.

This is possible with different techniques such as di-electrophoresis techniques or microfluidic techniques which allow positioning of the nanowires at specific locations, for example which allow the nanowires to be positioned in parallel.

By positioning the nanowires according to ordered structures, patterns, for example as ordered rows of nanowires positioned in a plane, the method according to the invention may have a high production capacity.

The nanowires adhere to the substrate, such as a layer, under the action of Van der Waals forces. Once they are deposited, the nanowires no longer move and remain at the location where they were initially deposited.

The following step of the method according to the invention or contacting step (step b)) may comprise an operation during which the semiconductor nanowires are covered with a metal or metalloid layer with view to forming the electrically conducting strips (7, 8).

Before depositing the metal on the nanowire, the native oxide layer for example $SiO_2$ in the case of silicon nanowires, is generally removed, at the surface of the nanowires for example by soaking in a buffered HF solution (BHF).

The deposition of the metal may be achieved on the first portion or area (19) of the surface of the silicon nanowire which will be in contact with the central portion (17) of the narrowed portion (7) between the first end (3) and the second end (5) of the first conducting line (1) and on the second portion or area (20) of the surface of the nanowire which will be in contact with the central portion (18) of the narrowed portion (8) between the first end (4) and the second end (6) of the second conducting line (2).

The metal which covers the nanowires is preferably selected from nickel, platinum and all the materials capable of forming metal alloys with the semiconductors making up the nanowire.

It was shown that the method worked particularly well with nickel, but also with platinum which is with nickel, the other material currently used in the microelectronics industry for manufacturing the contacts of transistors.

The amount of metal deposited on the nanowire depends on the diameter of the nanowire. Nanowires of larger diameter require larger amounts of metal.

The thickness of the metal or metalloid layer used for this invention is generally from 80 to 120 nm. This thickness may be modified according to the diameter of the semiconducting nanowires.

Generally, the thickness should be at least twice the diameter of the nanowire.

Thus, a typical thickness is of about 120 nm for nanowires with a diameter from 20 nm to 50 nm.

The deposition of the metal or metalloid on the nanowires may be achieved by any metal deposition process. This deposition is generally achieved by a method for evaporating metal by an electron beam («E-Beam Metal Evaporation»), wherein a metal target is bombarded by an electron beam, which causes an evaporation of the metal of the target.

Another deposition method is cathode sputtering. Deposition by cathode sputtering is advantageously used for depositing platinum contacts.

During step b) of the method, the first area of the surface of the nanowire (15) for example made of silicon is put into contact with the central portion (17) of the electrically conducting strip (7) between the first end (3) and the second end (5) of the first electrically conducting line (1), and a second area of the surface of the nanowire spaced apart from the first area in the direction of the length of the nanowire, is put into contact with the central portion (18) of the electrically conducting strip (8) between the first end (4) and the second end (6) of the second electrically conducting line (2).

It was seen above that the first (7) and the second (8) conducting strips are generally spaced apart from each other by 100 nm to 300 nm, for example 200 nm, consequently the first and the second areas of the nanowire are generally spaced apart from each other by 100 nm to 300 nm, for example 200 nm.

Generally, the first and second areas of the nanowire are generally put into contact at the center or practically at the center of each of the two central portions (17, 18), i.e. at the center or practically at the center of each of the two electrically conducting strips (7, 8) and of each of the two lines (1, 2).

The contacting may further comprise an operation during which electrically conducting strips are actually defined on the nanowires, for example by lithography.

By «almost at the center or practically at the center» is meant that the nanowire is positioned with an accuracy of about 200 nm or less and preferably of about 50 nm or less, for parallel conducting strips (7, 8) for example with a length of 3 µm and separated by 200 nm.

It should be noted that the accuracy of 200 nm is the accuracy which was obtained with the lithography system applied in the examples, but sophisticated lithography systems may give the possibility of obtaining much higher accuracy in the positioning of the nanowire, for example of the order of 50 nm or less.

However, with an accuracy of 200 nm, it was seen that the method worked very well.

The nanowire is generally placed below the two conducting strips (7, 8) as this is illustrated in FIG. 2 and in contact with each of these strips.

FIGS. 8A and 8B show a top view of a substrate on which are positioned several nanowires (81) and several devices according to the invention with conducting lines (82) comprising narrowed portions or strips (83).

Once the nanowire is thereby positioned, a potential difference said to be a first heating potential difference $V_{heating}$, is applied between the first end (3) of the first electrically conducting line (1) and the second end (5) of the first electrically conducting line made of a metal or metalloid (1), this potential difference being sufficient for causing heating-up of the central portion (17) of the narrowed portion (7) of the first electrically conducting line (1) and of the first area of the surface of the nanowire such that the metal or the metalloid diffuses into the nanowire (15) in order to form an alloy with the semiconductor, such as a metal silicide.

As this has already been indicated above, the current generator (9) is capable of providing the heating current which causes the heating by Joule effect of the strip (7), and this same generator, for each value of the heating current which crosses the strip (7) may provide a set, constant, bias voltage in the nanowire between the points (17) and (18).

The potential difference applied to the first conducting line (1), may thus be increased generally from zero potential, gradually or incrementally, in order to attain a value of the current such that it causes heating-up by Joule effect of the electrically conducting strip (7).

A current of about 15 to 20 mA, for example, is generally sufficient for causing diffusion of the metal or of the metalloid of the conducting strip into the nanowire and therefore formation of an alloy such as a silicide.

More specifically, each value of the current causes an instantaneous increase in the temperature of the electrically conducting strip (« stripline» ), but the inventors were able to show that a value of the current generally between 15 and 20 mA gave rise to the formation of an alloy, such as a silicide.

This current, generally of about 15 to 20 mA, is therefore the current ensuring heating, or more exactly a rise in the temperature of the central portion (17) of the narrowed portion (7) of the first electrically conducting line (1) such that it ensures diffusion of the metal inside the nanowire (15).

The increments with which the heating potential difference $V_{heating}$ is increased, may for example be 0.1 volt increments.

For each value of $V_{heating}$, the potential difference between both ends of the nanowire is maintained to a set value, for example of 1 volt. This potential difference gives rise to a leakage current through the nanowire, the value of which is directly related to the length of the semiconducting channel, which depends on the penetration length of the metal into the nanowire. This leakage current is used as a feedback parameter for controlling the alloy of the contacts and stopping the process at the desired channel length.

It is quite obvious that the value of the potential difference $V_{heating}$ which gives the possibility of obtaining heating-up of the central portion (17) of the narrowed portion of the first electrically conducting line (1) and diffusion of the metal varies according to the resistance of the first electrically conducting line (1) and of the first electrically conducting strip (7).

Generally for standard conducting lines and strips, this potential difference may for example be from 1 to 2 volts.

If the normalized resistance of the conducting line and of the conducting strip is considered, which is the ratio between the resistance R(I) (R'(I)) of the line and of the strip in which flows a current of intensity I, and the resistance of the same line and of the same strip at very low bias, this ratio will be greater than 1 as soon as there is heat dissipation, for example due to a higher temperature of the metal of the central portion of the narrowed portion of the conducting line, near the middle of the strip.

It may be considered that there is heating from a normalized resistance of 1 but that the $V_{heating}$ has to be increased and therefore the normalized resistance has to be increased to above 1.2 or even 1.3 so that the leakage current increases and so the alloy, such as a silicide, forms.

In other words, it was shown, as this has already been mentioned above, that the formation of an alloy, such as a silicide is accomplished by having a current between 15 and 20 mA pass into the electrically conducting line and into the electrically conducting strip (this is the same current which passes in the line and in the strip).

If one is interested in the normalized resistance, it was found experimentally that these values of the heating current correspond to values of the normalized resistor comprised between 1.2 and 1.3.

As proved by FIG. 6, when the normalized resistor reaches a value comprised between 1.2 and 1.3, one begins to measure a non-negligible current which crosses the nanowire and which indicates the formation of an alloy phase, for example of a silicide phase.

Without intending to be bound by any theory, and as this was already indicated above, the narrowed portion (7, 8) of the conducting lines (1, 2) forms a local obstacle to the passing of the current into the conducting strip. In other words, this narrowed portion forms a narrow portion, a shrinkage, a narrowing, a « constriction» for the passing of the current. Accordingly, a very high temperature is attained in the central portion of the electrically conducting strip where the nanowire is positioned.

This very high temperature may for example be from 400 to 1,000° C. It should be sufficient for activating the diffusion process of the metal into the nanowire and at the same time, it should not exceed the melting temperature of the metal in order not to cause its failure.

The hottest point generally corresponds to the middle of the narrowed portion of the conducting line.

The local heating of the contact because of heat dissipation by the Joule effect causes « annealing» of the contact.

In other words, the metal constituting the conducting strip, and which generally covers the nanowire, begins to diffuse inside the nanowire, in the direction of the thickness of the nanowire but also generally in the direction of the length of the latter, thus forming an alloy between the metal or metalloid constituting the conducting strip, which generally covers the nanowire, and the semiconductor of the nanowire such as silicon. This alloy is for example a metal silicide.

According to the invention, the length of the portion of the silicon nanowire where the alloy of the metal or metalloid and of the semiconductor such as a metal silicide is formed, is self-limiting.

This is due to the presence of the layer of electrically insulating material such as $SiO_2$ on which the nanowires are deposited and which plays the role of a drain, or heat sink. Thus, the length of the silicide portion around the contact between the first conducting strip and the nanowire is self-limited, for example to about 150 nm.

According to the invention, a potential difference, said to be a leakage potential difference is further measured on either side of a resistor R in series with the nanowire located between the second end (6) of the second electrically conducting line (2) and the ground.

By means of this measurement of the leakage potential, it is thereby possible to simultaneously follow, monitor the current called leakage current (16) which passes into the silicon nanowire (15) and then into the second electrically conducting strip (8) and finally into the resistor R.

It was seen that the value of the leakage current corresponding to a bias voltage between the points (17) and (18), or rather between the points (19) and (20) of the nanowire, of 1 volt, remained constant and close to zero up to a value of the normalized resistance of the first conducting line generally equal to 1 but suddenly increased from a determined value of the normalized resistance in order to attain about 7 nA for example.

More specifically, one begins by biasing the nanowire, for example with a voltage of 1 volt, for example between the points (17) and (18), or rather (19) and (20).

Next, the heating current which passes into the first electrically conducting line (1) and into the first electrically strip (7), is increased (this is the same current which passes in the line and in the strip) up to a value generally comprised between 15 and 20 mA while maintaining the bias potential set to 1 volt, between the points (17) and (18) or rather (19) and (20).

At a certain moment, one begins to measure a current of the order of a few nanoamperes which passes into the resistor R, and it is then that the alloy, such as a silicide, is formed.

One thus has available a means for monitoring, controlling the penetration, the infiltration of the metal or metalloid into the nanowire in thickness and generally in depth.

More specifically, it may be rather stated that the penetration of the alloy such as a silicide, is monitored, controlled, regulated all along the length of the nanowire.

It is possible to trigger, stop or accelerate the diffusion of the metal or metalloid and the formation of the alloy, for example of the metal silicide by modifying the value of the potential difference applied to the first electrically conducting line (1) and consequently the value of the intensity of the heating current which passes into the first electrically conducting line and into the first electrically conducting strip (this is the same current which passes in the line and in the strip).

The method according to the invention unlike the methods which apply annealing in a furnace, allows electric control of the metal/semiconductor alloying process. This control is carried out in situ by means of monitoring of the leakage current and of feedback on the heating current This method is reliable and reproducible since the electrically conducting strips for example defined by lithography on the nanowires always have the same geometry and the same resistance, as this was able to be shown by resistance measurements with four probes. The overall resistance and the geometry of the metal connection, line (1) or (2), in which the electrically conducting strip (7) or (8) is included, may vary but the process leading to the formation of the alloy, for example the formation of the metal silicide, is governed by the electrically conducting strip (7) or (8) and only by the latter.

Indeed, this process is governed by the power dissipated into the conducting strips (7) and (8) by Joule effect which in turn only depends on the resistance of the conducting strip.

In the case when it is desired to prepare a transistor, after having prepared an alloy such as a metal silicide at the first area of the nanowire (19), the roles played by the first and second electrically conducting lines (1, 2) are inverted and a potential difference, said to be a second heating potential difference is applied between the first end (4) of the second electrically conducting line (2) and the second end (6) of the second electrically conducting line (2), this potential difference being sufficient for causing heating-up of the central portion (18) of the electrically conducting strip (8) of the second electrically conducting line (2), and of the second area of the surface of the nanowire (20) such that the metal or metalloid diffuses into the nanowire (15) in order to form a metal or metalloid alloy such as a metal silicide.

At the same time, the potential difference between the contact points (19) and (20) is maintained set for example to 1 volt, in order to produce a leakage current through the nanowire while allowing feedback on the alloying process at the second contact (20).

The length of the channel of the transistor, determined by the penetration length of the metal/semiconductor alloy at the second contact (20), is directly related to the leakage current. As soon as the length of the channel is reduced, the leakage current increases.

As this may be seen in FIG. 3, such a transistor formed in a nanowire (31) made of a semiconductor, comprises two portions (32, 33) made of an alloy of the semiconductor and of the metal or metalloid, for example made of metal silicide, such as nickel silicide. These portions (32, 33) are formed in the nanowire from the contacts (34, 35) between the first and second electrically conducting strips (36, 37) and the nanowire (31) and a central portion (38) made of a semiconductor, for example made of silicon. This central portion of the nanowire constitutes the channel of the transistor.

As this was specified above, in the method according to the invention, electric control of the length (39) of the channel of the transistor is achieved by observing the leakage current (first and second leakage currents).

The curve of FIG. 4 shows that it is possible to actually adjust the length of the channel of a transistor with a nanowire by adjusting the value of the leakage current.

The microphotograph of FIG. 5 as well as the one of FIG. 7, show that the method according to the invention gives the possibility of manufacturing transistors with silicon nanowires with channel lengths of about 20 nm.

The invention will now be described with reference to the following example given as an illustration and not as a limitation.

EXAMPLE

Silicon nanowires are grown on a substrate by a chemical vapor deposition ( « CVD » ) method.

The nanowires are then separated from the growth substrate by means of slight stirring with ultrasound which causes their release in an isopropanol solution.

Next, the nanowires are dispersed with a pipette on a heavily doped silicon substrate covered with a thermal oxide layer of high quality with a thickness of about 300 nm.

The heavily doped silicon substrate is used as a gate electrode.

The position of the nanowires on the substrate is located by means of pre-existing alignment marks. The metal contacts on each of the nanowires are defined by a lithography step with an electron beam, a metal deposition step with an electron beam (120 nm of nickel), and a « lift-off» step by immersion in acetone for 10 minutes at about 55° C.

Before the deposition of the metal, the native oxide on the surface of the nanowires is removed by soaking for 5 seconds in buffered 5/1 hydrofluoric acid ( « BHF » ) containing 5.40% of $NH_4F$ and 1.49% of HF.

The device for forming a metal silicide on the nanowires applied in this example is the device described in FIG. 2.

More specifically, silicon nanowires were synthesized from gold nanoparticles in a chemical vapor deposition (CVD) reactor.

The nanowires are non-doped nanowires with diameters from 20 to 40 nm.

The manufacturing of the devices according to the invention, with view to applying the method according to the invention, is accomplished in the following way:

1. the silicon nanowires are deposited on a heavily doped silicon substrate, with a surface layer of thermal oxide of about 300 nm in thickness;
2. a layer of PMMA (poly(methyl methacrylate)) is deposited and the position of the nanowires is marked relatively to a predefined network of metal studs, bumps, so-called alignment markers;
3. the surface is exposed to an electron beam in order to define lines which will be successively metallized;
4. the sample is put into a solution of methyl isobutyl ketone («MIK») and of isopropanol which only removes the PMMA exposed to the electron beam;
5. the sample is immersed for about six seconds in a «BHF» solution based on hydrofluoric acid in order to remove the layer of silicon oxide which covers the exposed surface of the nanowires;
6. just after this chemical etching, the sample is transferred into an electron sputtering frame and a layer of about 80 to 120 nm of metal, for example of nickel, is deposited;
7. the making of the sample is completed with a so-called «lift-off» process carried out in an acetone bath which removes the PMMA and the metal layer above. Consequently, the metal remaining only matches the lines defined by the electron beam and which become for each contacted nanowire, the metal lines (1) and (2) and the metal strips (7) and (8), positioned parallel with each other, both of these strips each being perpendicular to the nanowire.

Each of the strips (7, 8) generally has a length of 3 μm and both strips are generally separated by 200 nm.

The nanowire is therefore positioned under each of the strips and is in contact with the latter substantially in the middle of each of them, with an accuracy for example of about 200 nm.

With a voltage generator, the potential difference $V_{heating}$ is increased in the first line (1), while keeping a set potential difference for example of 1 volt, between the points (17) and (18), or rather (19) and (20), in order to produce a leakage current for monitoring the process.

The heating current, induced by the potential difference $V_{heating}$, may reach a value of about 15 to 20 mA. The potential difference applied between the points (3) and (5) is of about 1 volt.

The strip (7) acts as a constriction towards the passing of the current, so that a very high temperature is attained in the central portion (17) of the metal strip (7), there where the nanowire is in contact with the strip (7).

The local heating of the contact by Joule effect causes annealing of the contact. In other words, the metal, such as nickel, which covers the nanowire begins to diffuse towards the inside of the nanowire in order to form a metal alloy, for example of nickel and silicon, i.e. a metal silicide.

By means of the apparatus applied according to the invention, it is possible to control at the same time the current which passes into the nanowire by measuring the potential difference $V_{leak}$ in the resistor R which is positioned in series with the nanowire at the end of the second line (2).

In order to be able to track in real time the modifications which are induced in the morphology of the nanowire, experiments were conducted with an SEM equipped for carrying out electric measurements while observing the nanowire.

In FIG. 6, the measured values of the leakage current (curve B) which passes in the nanowire versus time as well as the value of the normalized resistance (curve A) of the first line (1) are plotted.

The normalized resistance of the first line (1) is the ratio between the resistance R (I) of the strip in which passes a current of intensity I, and the resistance of the strip at a very low bias.

This ratio is greater than 1 as soon as there is heat dissipation, for example due to a higher temperature of the metal close to the middle of the strip.

When the potential is increased by increments of 0.1V, increments of the normalized resistance are measured, which show that for each value of the potential difference which is applied, instantaneous heating of the metal is induced. The leakage current in the nanowire remains constant until the normalized resistance of the line reaches a value close to 1.3, which corresponds to a value of the current which passes into the nanowire of about 7 nA (see FIG. 6).

FIG. 7 is a microphotograph taken with the SEM of the device with which a treatment with heating by Joule effect has been carried out on both sides of the nanowire (71); i.e. the heating voltage was first of all applied to the first strip (72), no heating voltage being applied to the second strip (73) and then the heating voltage was applied to the second strip (73), no heating voltage being applied to the first strip (72).

As obviously shown by the photograph, brighter regions, indicated by the arrows (74), just below each contact, appear after the treatment. These brighter regions correspond to silicide regions of nickel silicide.

The photograph therefore demonstrates that local heating via Joule effect may actually form a silicide on a silicon nanowire.

Further, by measuring at the same time the leakage current which passes in the nanowire, there is thus a means for controlling the penetration of the metal along the nanowire and optionally in principle, also the depth of the penetration of the metal.

The invention claimed is:

1. A device for forming, on a nanowire comprising a semiconductor, an alloy of the semiconductor with a metal or metalloid, said device comprising:
   (a) a first electrically conducting strip comprising a metal or metalloid capable of forming an alloy with the semiconductor of the nanowire, and a second electrically conducting strip comprising a metal or metalloid capable of forming an alloy with the semiconductor of the nanowire,
   the first electrically conducting strip and the second electrically conducting strip spaced apart from each other; the first electrically conducting strip forming a narrowed portion of a first electrically conducting line and the second electrically conducting strip forming a narrowed portion of a second electrically conducting line, and
   each of the first electrically conducting line and the second electrically conducting line comprising a first end and a second end;
   wherein a central portion of the first electrically conducting strip is capable of being placed into contact with a first area of the surface of the nanowire and a central portion of the second electrically conducting strip is capable of being placed into contact with a second area of the surface of the nanowire, said second area spaced apart from the first area in the direction of the length of the nanowire;

(b) a first generator for applying a potential difference between the first end of the first electrically conducting line and the second end of the first electrically conducting line and for making a current pass from the first end of the first electrically conducting line to the second end of the first electrically conducting line; and a first connector comprising a first resistor R connecting the second end of the second electrically conducting line to ground;

(c) optionally, a second generator for applying a potential difference between the first end of the second electrically conducting line and the second end of the second electrically conducting line when no potential difference is applied between the first end of the first electrically conducting line and the second end of the first electrically conducing line, and for making a current pass from the first end of the second electrically conducting line to the second end of the second electrically conducting line; and a second connector comprising a second resistor R' connecting the second end of the first electrically conducting line to ground;

(d) a measuring device for measuring a first leakage potential difference on both sides of the first resistor R;

(e) optionally, when the second generator of (c) is present, a measuring device for measuring a second leakage potential difference on both sides of the second resistor R';

(f) a third generator for applying a first bias potential difference between the first area of the surface of the nanowire and the second area of the surface of the nanowire, in the direction of the length of the nanowire;

(g) optionally, when the first bias potential difference is not applied, a fourth generator for applying a second bias potential difference between the second area of the surface of the nanowire and the first area of the surface of the nanowire, in the direction of the length of the nanowire.

2. The device according to claim 1, wherein the first electrically conducting strip and the second electrically conducting strip are parallel.

3. The device according to claim 1, wherein the first electrically conducting strip and the second electrically conducting strip each have a length from 1 to 5 µm.

4. The device according to claim 1, wherein the first electrically conducting strip and the second electrically conducting strip are spaced apart from each other by 100 nm to 300 nm.

5. The device according to claim 1, wherein the first electrically conducting strip and the second electrically conducting strip comprise nickel or platinum.

6. The device according to claim 1, wherein the first generator for applying a potential difference between the first end of the first electrically conducting line and the second end of the first electrically conducting line, and the optional second generator for applying a potential difference between the first end of the second electrically conducting line and the second end of the second electrically conducting line are capable of increasing or reducing the potential difference continuously or incrementally, manually or automatically.

7. The device according to claim 6, wherein the first generator for applying a potential difference between the first end of the first electrically conducting line and the second end of the first electrically conducting line, and the optional second generator for applying a potential difference between the first end of the second electrically conducting line and the second end of the second electrically conducting line are capable of increasing or reducing the potential difference continuously or incrementally, manually or automatically, according to the measured value of the first leakage potential difference or of the second leakage potential difference, respectively.

8. The device according to claim 1, wherein the first generator for applying a potential difference between the first end of the first electrically conducting line and the second end of the first electrically conducting line and the third generator for applying a first bias potential difference between the first area of the surface of the nanowire and the second area of the surface of the nanowire, in the direction of the length of the nanowire, comprise the same first voltage generator.

9. The device according to claim 8, wherein the optional second generator for applying a potential difference between the first end of the second electrically conducting line and the second end of the second electrically conducting line and the optional fourth generator for applying a second bias potential difference between the second area of the surface of the nanowire and the first area of the surface of the nanowire, in the direction of the length of the nanowire, comprise the same second voltage generator.

10. The device according to claim 9, wherein said first voltage generator and said second voltage generator are replaced with a single voltage generator which is capable of applying a potential difference between the first end of the first electrically conducting line and the second end of the first electrically conducting line and a potential difference between the first area of the surface of the nanowire and the second area of the surface of the nanowire, in the direction of the length of the nanowire; or is capable of applying a potential difference between the first end of the second electrically conducting line and the second end of the second electrically conducting line, and a potential difference between the second area of the surface of the nanowire and the first area of the surface of the nanowire, in the direction of the length of the nanowire.

11. The device according to claim 1, comprising several first electrically conducting strips and second electrically conducting strips.

12. A method for forming, on at least one nanowire comprising a semiconductor, an alloy of the semiconductor with a metal or metalloid, comprising the following successive steps:

(a) depositing at least one nanowire comprising a semiconductor on a substrate comprising electrically insulating material, the substrate optionally positioned on another substrate comprising a material different from said electrically insulating material;

(b) contacting a first area of the surface of the nanowire with a central portion of a first electrically conducting strip comprising a metal or metalloid capable of forming an alloy with the semiconductor of the nanowire, forming a narrowed portion between a first end of a first electrically conducting line and a second end of a first electrically conducting line; and contacting a second area of the surface of the nanowire, spaced apart from the first area in the direction of the length of the nanowire, with a central portion of a second electrically conducting strip comprising a metal or metalloid capable of forming an alloy with the semiconductor of the nanowire, forming a narrowed portion between a first end of a second electrically conducting line and a second end of a second electrically conducting line;

(c) applying a first bias potential difference between the first area of the surface of the nanowire and the second area of the surface of the nanowire, in the direction of the length of the nanowire;

(d) applying a first heating potential difference between the first end of the first electrically conducting line and the second end of the first electrically conducting line, while maintaining the first bias potential difference constant and simultaneously measuring a first leakage potential difference on either side of a first resistor R in series with the nanowire, located between the second end of the second electrically conducting line and ground;

(e) increasing the first heating potential difference, continuously or incrementally, manually or automatically, from a value close to zero until a jump in the first leakage potential difference is observed, indicating that the first heating potential difference is sufficient for causing (i) heating-up of the central portion of the first electrically conducting strip and of the first area of the surface of the nanowire, and (ii) diffusion of the metal or metalloid in and along the nanowire, thereby forming the alloy.

13. The method according to claim 12, wherein the semiconductor is silicon, optionally doped silicon.

14. The method according to claim 12, wherein the nanowire has a length from 0.5 to 10 µm and a diameter from 20 to 50 nm.

15. The method according to claim 12, wherein the substrate comprising an electrically insulating material is a silica layer optionally positioned on a substrate in heavily doped silicon; a substrate comprising silicon nitride; or a substrate comprising alumina.

16. The method according to claim 12, wherein more than one nanowire is deposited on the substrate comprising an electrically insulating material, said nanowires being positioned randomly, their position optionally marked with marks made beforehand on the substrate, or according to ordered structures.

17. The method according to claim 16, wherein the ordered structures are in the form of ordered rows of nanowires.

18. The method according to claim 12, wherein the metal is selected from the group consisting of nickel and platinum.

19. The method according to claim 12, wherein the first heating potential difference is modified according to the measured first leakage potential difference.

20. The method according to claim 12, further comprising the following steps:

(f) applying a second bias potential difference between the second area of the surface of the nanowire and the first area of the surface of the nanowire, in the direction of the length of the nanowire;

(g) applying a second heating potential difference between the first end of the second electrically conducting line and the second end of the second electrically conducting line, while maintaining constant the second bias potential difference, and simultaneously measuring a second leakage potential difference on both sides of a second resistor R' in series with the nanowire, located between the second end of the first electrically conducting line and ground;

(h) increasing the second heating potential difference, continuously or incrementally, manually or automatically, from a value close to zero until a jump in the second leakage potential difference is observed, indicating that the second heating potential difference is sufficient for causing (i) heating-up of the central portion of the second electrically conducting strip and of the second area of the surface of the nanowire, and (ii) diffusion of the metal or metalloid in and along the nanowire, thereby forming the alloy.

21. The method according to claim 20, wherein the second heating potential difference is modified according to the measured second leakage potential difference.

22. The method according to claim 21, wherein the first heating potential difference and/or the second heating potential difference is modified in order to obtain a first portion comprising an alloy and/or a second portion comprising an alloy with determined lengths along the nanowire from the first area of the surface of the nanowire and/or from the second area of the surface of the nanowire.

23. The method according to claim 22, wherein the portion of the length of the nanowire between the first portion comprising an alloy and the second portion comprising an alloy is the channel of a transistor.

24. The method according to claim 20, further comprising establishing a calibration curve providing, for each value of the leakage current, the length of the channel of the transistor, and, adjusting the first heating potential and/or the second heating potential to obtain the desired channel length.

25. The method according to claim 12, wherein the electrically conducting strips are defined directly on the nanowire.

26. The method according to claim 25, wherein the electrically conducting strips are defined directly on the nanowire by a lithography process.

* * * * *